(12) United States Patent
Hata et al.

(10) Patent No.: US 6,569,693 B2
(45) Date of Patent: May 27, 2003

(54) METHOD FOR FABRICATING EPITAXIAL SUBSTRATE

(75) Inventors: Masahiko Hata, Tsuchiura (JP); Yasunari Zempo, Tsukuba (JP)

(73) Assignee: Sumitomo Chemical Company, Limited, Osaka (JP)

( * ) Notice: Subject to any disclaimer, the term of this patent is extended or adjusted under 35 U.S.C. 154(b) by 0 days.

(21) Appl. No.: 09/865,482

(22) Filed: May 29, 2001

(65) Prior Publication Data

US 2001/0051382 A1 Dec. 13, 2001

(30) Foreign Application Priority Data

May 30, 2000 (JP) ........................................ 2000-159707

(51) Int. Cl.[7] .............................................. H01L 21/66
(52) U.S. Cl. .............................. 438/14; 438/15; 438/16; 438/758
(58) Field of Search ............................. 438/14, 15, 16, 438/758, 9, 81

(56) References Cited

U.S. PATENT DOCUMENTS

| | | | | |
|---|---|---|---|---|
| 3,992,233 A | * | 11/1976 | Farrow ........................ | 148/175 |
| 4,945,254 A | * | 7/1990 | Robbins ....................... | 250/571 |
| RE33,292 E | * | 8/1990 | Bradley et al. ................. | 556/1 |
| 4,950,621 A | * | 8/1990 | Irvine et al. ................... | 438/81 |
| 5,277,769 A | * | 1/1994 | Medernach .............. | 204/129.3 |
| 5,371,399 A | * | 12/1994 | Burroughes et al. ........ | 257/451 |
| 5,471,948 A | * | 12/1995 | Burroughes et al. ........ | 117/105 |
| 5,508,829 A | * | 4/1996 | Freeouf et al. ................. | 359/3 |
| 5,851,842 A | * | 12/1998 | Katsumata et al. ............ | 438/9 |
| 5,980,978 A | * | 11/1999 | Jones et al. .................... | 427/96 |
| 6,211,094 B1 | * | 4/2001 | Jun et al. ..................... | 438/758 |
| 6,284,552 B1 | * | 9/2001 | Yamagata et al. ............ | 438/14 |

OTHER PUBLICATIONS

Goto et al., Sumitomo Kagaku, pp. 50–65, (1994–II).

* cited by examiner

Primary Examiner—John F. Niebling
Assistant Examiner—Olivia T Luk
(74) Attorney, Agent, or Firm—Birch, Stewart, Kolasch & Birch, LLP

(57) ABSTRACT

Provided is a method for fabricating a compound semiconductor multilayer epitaxial substrate comprising a plurality of epitaxial layers, comprising the steps of determining at least one of the thickness, impurity concentration, and composition of an epitaxial layer comprising the multilayer epitaxial substrate by theoretical calculation, the theoretical calculation describing on electric field and charge distribution inside the epitaxial layer, and performing epitaxy of the epitaxial layer according to the theoretical calculation of the thickness, impurity concentration and/or composition of the epitaxial layer so that measurable electric characteristics of the substrate predetermined by the calculation are satisfied. The method can reduce the fabrication process and also can be applied to manufacture a multilayer epitaxial substrate having a unique structure.

9 Claims, 5 Drawing Sheets

| n+-GaAs | >5E18cm-3 | 1000Å |
|---|---|---|
| i-AlGaAs(x=0.24) | | 325Å |
| δ-doped | 3E12cm-2 | |
| i-AlGaAs(x=0.24) | | 40Å |
| i-InGaAs(y=0.20) | | 130Å |
| i-AlGaAs(x=0.24) | | 325Å |
| δ-doped | 1E12cm-2 | |
| i-AlGaAs(x=0.24) | | 40Å |
| Buffer | | |
| i-GaAs | | 5000Å |
| GaAs S.I. Sub. | | |

Figure 3

| First Layer | Si-doped n-type GaAS   100nm, $3.0 \times 10^{18}/cm^3$ |
|---|---|
| Second Layer | Non-doped GaAS   20 nm |
| Third Layer | Non-doped AlGaAs  (Al=0.2)   19 nm |
| Fourth Layer | Si-doped n-type AlGaAs  (Al=0.2)   10 nm |
| Fifth Layer | Non-doped InGaAs  (In=0.2)   15 nm |
| Sixth Layer | Si-doped n-type AlGaAs  (Al=0.2)   4 nm |
| Seventh Layer | Non-doped AlGaAs  (Al=0.2)   100 nm |
| Eighth Layer | Non-doped GaAs   500 nm |
| Substrate | Semi-insulating single crystal GaAs substrate |

Figure 4

| First Layer | Si-doped n-type GaAS   100nm, $3.0 \times 10^{18}/cm^3$ |
|---|---|
| Second Layer | Non-doped AlGaAs  (Al=0.2)  27.5 nm |
| Third Layer | Si-doped n-type AlGaAs (Al=0.2) $2.0 \times 10^{18}/cm^3$, 10 nm |
| Fourth Layer | Si-doped n-type InGaAs  (In=0.18) $1.0 \times 10^{18}/cm^3$, 15 nm |
| Fifth Layer | Non-doped AlGaAs  (Al=0.2)  100 nm |
| Sixth Layer | Non-doped GaAs  500 nm |
| Substrate | Semi-insulating single crystal GaAs substrate |

Figure 5

| First Layer | Si-doped n-type GaAS   100nm, $3.0 \times 10^{18}/cm^3$ |
|---|---|
| Second Layer | Non-doped AlGaAS (Al=0.2)   34 nm |
| Third Layer | Si-doped n-type AlGaAs  (Al=0.2)   4 nm |
| Fourth Layer | Non-doped AlGaAs  (Al=0.2)   2 nm |
| Fifth Layer | Non-doped InGaAs  (In=0.2)   15 nm |
| Sixth Layer | Non-doped AlGaAs  (Al=0.2)   2 nm |
| Seventh Layer | Si-doped n-type AlGaAs  (Al=0.2)   $3.0 \times 10^{18}/cm^3$, 4 nm |
| Eighth Layer | Non-doped AlGaAs (Al=0.2)   100 nm |
| Ninth Layer | Non-doped GaAs 500 nm |
| Substrate | Semi-insulating single crystal GaAs substrate |

METHOD FOR FABRICATING EPITAXIAL SUBSTRATE

BACKGROUND OF THE INVENTION

1. Field of the Invention

A present invention relates to a method for fabricating a multilayer epitaxial substrate used for high speed electronic devices, in particular, for field effect transistors or integrated circuits including field effect transistors.

2. Description of the Related Art

The field effect transistor (FET) is a three-terminal device where an electron stream flowing between two terminals (source and drain) is controlled with the effect of an electric field applied to a gate electrode provided midway between the two terminals as the name implies. This is a type of transistor currently in widespread use as various amplifiers and switching elements particularly with a material made of GaAs or Si. GaAs is widely used especially in the high-frequency field due to its high electron velocity and excellent insulating characteristic and low dielectric loss characteristic in view of its high substrate resistance. These characteristics can be further improved by using a multilayer hetero-epitaxial substrate.

For example, one type of heterojunction FET called a pseudomorphic high electron mobility transistor (p-HEMT) includes an InGaAs layer and electron supply layers such as AlGaAs layers formed near the InGaAs layer. Electrons injected from a source electrode pass through layers including the electron supply layer vertically to enter the InGaAs layer having higher electron affinity and flow inside the InGaAs layer along an electric field formed in the drain direction. The current density is determined by the product of the electron density and the electron velocity.

In the heterojunction FET, the density and velocity of electrons flowing in the InGaAs layer are determined by the concentration and distribution of a donor impurity added to the n-type AlGaAs layers formed on both (upper and lower) sides of the InGaAs layer, the electric field applied to the gate, and the like. The heterojunction FET has superior device characteristics to those of general FETs due to the following reasons.

First, electrons flow in the InGaAs layer that has high electron velocity in a high electric field. Second, the donor impurity that will be a large cause of scattering of electrons is added only to the n-type AlGaAs layers and thus spatially separated from the InGaAs layer in which the electrons actually run. Third, the AlGaAs layer, having a large energy gap, is interposed between the gate electrode and the electron running layer. Therefore, leak current from the gate to the electron running layer, which will otherwise cause deterioration of FET characteristics, is not easily generated. This enables operation in a high electric field.

In fabrication of such a heterostructure FET, in order to maximize the characteristics described above, importance must be placed in particular, on the design and control of the extra-thin crystal layers, such as the n-type AlGaAs layers on the upper and lower sides of the InGaAs layer.

For example, in the p-HEMT, a typical type of heterojunction FET presently used, control of the threshold voltage ($V_{th}$) is an important device parameters related to the crystal structure by the following Expression 1:

[Expression 1]

$$V_{th} = \phi - \Delta E_c - qNd^2/2\epsilon\epsilon_0 \quad (1)$$

(where $V_{th}$: threshold voltage (V)

$\phi$: surface energy barrier height of the gate electrode portion (eV)

$\Delta E_c$: energy difference at the bottom ends of the conduction bands of AlGaAs and InGaAs (eV)

q: charge elementary quantity (C)

N: donor concentration of the electron supply layer d: thickness of the electron supply layer $\epsilon\epsilon_0$: dielectric constant)

The above expression is for a p-HEMT having a simple structure composed of a single uniformly-doped electron supply layer and an InGaAs layer formed in contact with the electron supply layer. In many cases, actual crystals have multilayer junctions including numerous layers having different doping concentrations, compositions, and thicknesses in order to improve gate breakdown voltage and control of the channel electron density. It is therefore difficult to adopt the simplified expression as described above for actual devices.

In reality, therefore, the following technique has been adopted. An epitaxial substrate is first designed using appropriate values for the doping concentration, composition, and thickness of each epitaxial layer, which are important as design parameters. Various epitaxial substrates are fabricated by varying the above-mentioned design parameters of doping concentration, composition, and epitaxial layer thickness, and then devices are actually fabricated using such epitaxial substrates. The characteristics of the resultant devices are measured, to determine an epitaxial layer structure satisfying predetermined characteristics. Conventional device processing, however, generally requires a long time. In the conventional technique, it takes an extremely long time to determine the structure.

In addition, in the epitaxy process, problem arises in relation to the control of parameter such as the thickness, doping concentration, and composition of each layer, all of which are important for fabrication of the multilayer epitaxial substrate. Since the epitaxial layers are very thin, it is difficult to directly measure these values. Therefore, thick films are separately prototyped to enable direct measurement of the parameter values under the same conditions as those adopted in the fabrication of the multilayer epitaxial substrate. The thickness, doping concentration and composition of each layer are thus confirmed using these thick films before the multilayer epitaxial substrate is actually fabricated.

It will be appreciated that the conventional technique requires a considerably long time for feedback. Moreover, the conventional technique is disadvantageous in some cases when it is applied to various heterojunction FETs.

For example, it is known that, in the case of a very high concentration impurity doping, the impurity is activated to enable effective doping when the epitaxial layer is very thin, thin enough to be usable for the heterojunction crystal, but it is significantly inactivated when the epitaxial layer is thick (Y. Sasajima, M. Hata, Applied Physics Letters, 75, 2596 (1999)). Thus, in this case, preliminary confirmation of the parameters using thick films is impossible.

In the p-HEMT, the InGaAs channel layer itself may sometimes be doped with an impurity to increase the electron concentration of the channel layer. Normally, the InGaAs channel layer of the p-HEMT is a very thin film having a thickness of several tens of nanometers or less to avoid occurrence of so-called "lattice relaxation". When preliminarily measurement of the impurity concentration of the channel layer using a thick film as described above is attempted, a number of misfit dislocations are generated in the crystal of the thick film due to lattice relaxation. This influences the effective impurity concentration, making it virtually impossible to evaluate the impurity concentration.

The object of the present invention is to provide a method for fabricating a compound semiconductor multilayer epitaxial substrate that can substantially reduce the fabrication processes and also can be used to manufacture a multilayer epitaxial substrate having a unique structure for which conventional techniques cannot be utilized.

SUMMARY OF THE INVENTION

The present inventors have vigorously examined the above problems and invented a method for solving the above problems.

That is, the present invention is directed to a method for fabricating a compound semiconductor multilayer epitaxial substrate by determining one or more of the thicknesses, impurity concentrations, and compositions of epitaxial layers constituting the multilayer epitaxial substrate by theoretical calculation so that predetermined electric characteristics are satisfied, and performing epitaxy according to the determined values.

Additionally, the present invention is directed to a method for fabricating a compound semiconductor multilayer epitaxial substrate comprising obtaining electric characteristics of epitaxial layers constituting the multilayer epitaxial substrate from predetermined design values for the thicknesses, impurity concentrations, and compositions of the epitaxial layers by theoretical calculation. The thicknesses, impurity concentrations, and compositions of the epitaxial layers are then adjusted during epitaxy so as to agree with the theoretical electric characteristics, and thus accomplish the epitaxy.

Further, prior to fabrication of a compound semiconductor multilayer epitaxial substrate in accordance with the present invention, the thicknesses, impurity concentrations, or compositions of epitaxial layers are adjusted by the methods described above for an epitaxial substrate in which the entire or part of a top-layer n-type epitaxial layer doped in a concentration of $3 \times 10^{17}/cm^3$ or more (with which an ohmic electrode of the heterostructure field effect transistor is to be in contact) has not been epitaxially grown or has been removed by etching. Subsequently, the same structure is epitaxially grown under the same conditions to deposit a top-layer n-type epitaxial layer doped in a concentration of $3 \times 10^{17}/cm^3$ or more with which the ohmic electrode of the heterostructure field effect transistor is to be in contact, to complete the epitaxy.

BRIEF DESCRIPTION OF THE DRAWINGS

FIG. 1a is a graph showing the electron potential shape and electron distribution of a multilayer epitaxial substrate obtained by theoretical calculation (the solid line representing the band structure and the dotted line representing the charge density distribution).

FIG. 1b is a cross sectional view of the structure of a multilayer epitaxial substrate used for the calculation illustrated in FIG. 1a.

FIG. 3 is a cross sectional View of the structure of the multilayer epitaxial substrate fabricated in Example 1.

FIG. 4 is a cross sectional view of the structure of the multilayer epitaxial substrate fabricated in Example 2.

FIG. 5 is a cross sectional view of the structure of the multilayer epitaxial substrate fabricated in Example 3.

DETAILED DESCRIPTION OF THE INVENTION

Figures 1A, 1B:
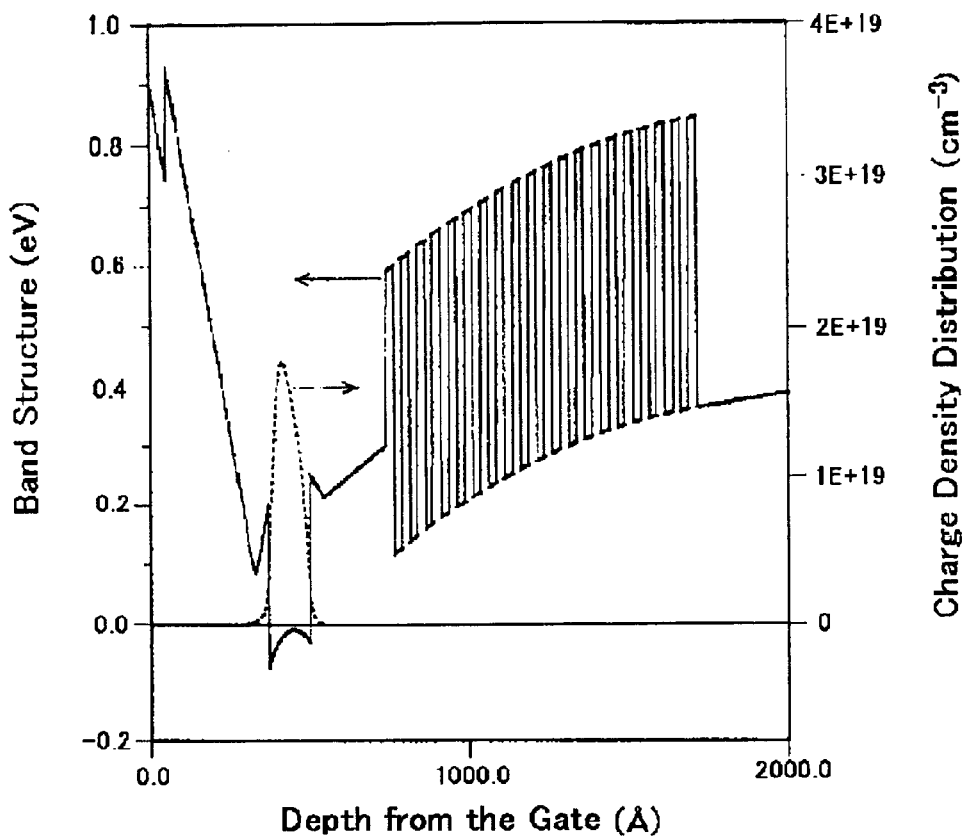

According to the present invention, any suitable substrate material and epitaxial layer material may used. The substrate used for the epitaxy is preferably made of Si, GaAs, InP, or sapphire, and the epitaxial layers are preferably made of a single crystal III–V group compound semiconductor where the III group element includes any of Al, Ga, and In and the V group element includes any of N, P, and As.

According to the present invention, the compound semiconductor multilayer epitaxial substrate is preferably used for fabrication of a heterostructure field effect transistor or an integrated circuit including a heterostructure field effect transistor. Of course, the present invention may be used to fabricate other types of transisters, as would be apparent to one skilled in the art.

According to the present invention, the heterostructure field effect transistor preferably includes an $Al_xGa_{(1-x)}As$ ($0 \leq x \leq 1$) layer and at least one $In_yGa_{(1-y)}As$ ($0 \leq y \leq 1$) layer.

Also, according to the present invention, the heterostructure field effect transistor preferably has a junction of crystal layers having different electron affinities, and thus has a selectively doped structure constructed of the junction.

Further, according to the present invention, the compound semiconductor multilayer epitaxial substrate preferably includes at least one $In_yGa_{(1-y)}As$ ($0 \leq y \leq 1$) layer, and this layer is preferably an electron running channel layer.

According to the present invention, the compound semiconductor multilayer epitaxial substrate preferably includes at least one $In_yGa_{(1-y)}As$ ($0 \leq y \leq 1$) layer that does not lattice-match with a substrate single crystal and has a thickness within a lattice relaxation limit, and this layer is preferably an electron running channel layer.

Further, according to the present invention, the $In_yGa_{(1-y)}As$ ($0 \leq y \leq 1$) layer is preferably an n-type doped layer.

In a heterojunction FET, the current value that is responsible for the operation of the FET is determined by the electrons flowing in an InGaAs channel, and the current density is determined by the electron density and electron velocity that are in return determined by the distribution of an ionized impurity in the vicinity of the channel, the electric field applied to the gate, the film thickness distribution, and the like. In an epitaxial substrate, the layer structure and the impurity distribution are smooth and uniform. The gate electric field originally has a three-dimensional distribution in the vicinity of the gate electrode. However, in a device having a gate length of about 0.5 to 1 $\mu$m, which is normal for a GaAs device, the electric field can be considered as being distributed smoothly and uniformly in the narrow region immediately below the gate where the current flow is controlled, as in epitaxial layers.

Also, in a device having a gate length as discussed above, the electron velocity can be considered substantially constant, and, if so, the current value is proportional to the electron density. Accordingly, in order to obtain the correlation between the channel current and the gate potential in an actual FET, it is necessary to find the correlation between the channel electron density and the surface potential the gate actually controls, in the cross section of epitaxial layers.

FIG. 1 is an example of calculation of an energy band on the conduction band side (a) and an electron distribution (b) in the cross section of epitaxial layers of a heterojunction FET obtained by actually solving a Poisson's equation and a wave equation in a self-consistent manner. It is known that a high-density surface level is generated in the surface portion of a GaAs semiconductor and for this reason the surface potential of the crystal is fixed at or around a position about 0.8 eV from the bottom end of the conduction band. As a result of the calculation based on the assumption of such an electric field distribution, it has been found that most electrons are confined within the InGaAs channel layer.

Figure 2:
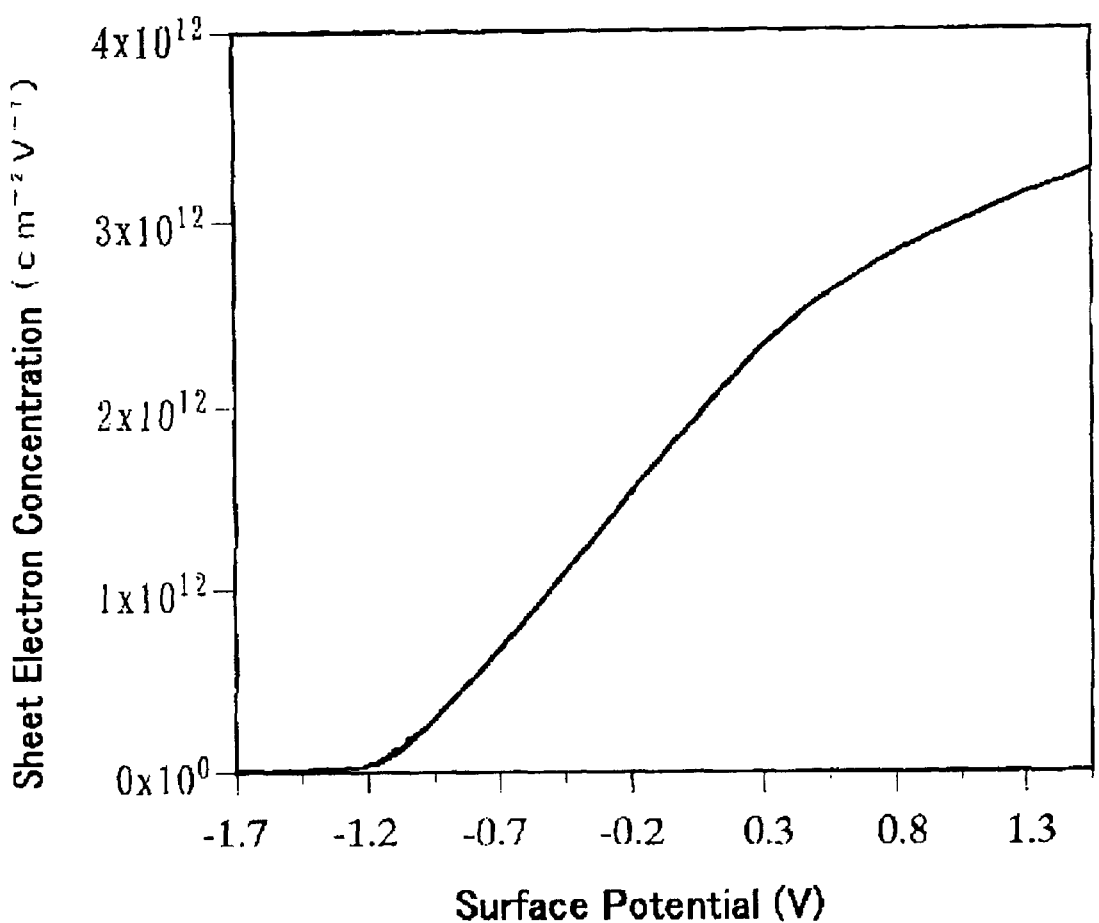
FIG. 2 is a graph showing the change in sheet electron concentration with change of the surface potential, obtained by a calculation method as shown in FIG. 1.

Similar calculation was performed by shifting the surface potential. As a result, with increase and decrease of the potential, the InGaAs channel electrons increased and decreased. FIG. 2 is a plot of the thus-obtained integrated values of the InGaAs channel electron density with respect to the surface potential. As the surface potential is closer to zero, the InGaAs channel electron density is saturated.

In the actual operation of a p-HEMT, electrons injected from the source electrode pass through layers located below the source electrode to flow into the InGaAs layer. The electrons then flow in the lateral direction passing right under the gate electrode to finally reach and flow into the drain electrode. The electron stream flowing in the InGaAs channel increases or decreases depending on the electric field from the gate electrode, but the potential in crystal cross section under the gate has a shape as that obtained in FIG. 1.

In the case of a Schottky barrier gate used in a heterojunction FET, a gate electrode metal is formed on an AlGaAs crystal. In the surface portion of the AlGaAs, also, as in the case of GaAs, the surface Fermi level is virtually fixed due to the high-density surface level. Therefore, shift of the gate potential is substantially equivalent to the shift of the surface potential adopted to obtain the plot of FIG. 2.

The current density of the channel is proportional to the product of the electron density and the electron velocity. In general, the electron velocity can be approximated to a constant value (1 to $1.5 \times 10^7$ cm/sec in the case of InGaAs). It is therefore found that the relationship between the electron density and the surface potential obtained in FIG. 2 is substantially equivalent to the relationship between the drain current density and the gate potential of the heterojunction FET.

In other words, it has been found that the one-dimensional calculation results of the potential and electron density used as described above can be associated with the operation characteristics of the actual heterojunction FET.

In the heterojunction FET, the current value obtained when the gate voltage is zero and the gate voltage value obtained when the current value is zero (threshold voltage) are important device characteristics. These values must be measured using a device that has been actually fabricated. However, it takes a long time to actually manufacture a device and then measure the characteritics of the device. To solve this problem, the following method has been found industrially valuable.

That is, the current value can be replaced with the integrated value of the electron density. The integrated value of the electron density obtained when the surface potential is 0.8 V is experimentally measurable by Hall measurement. Also, it is possible to define, as the threshold value, the value obtained by subtracting the level at which the Fermi level is fixed due to the surface level (0.8 V in the case of GaAs) from the surface potential observed when the electron density is negligibly low. For the measurement of the above value, it is not necessary to actual fabricate a FET. Instead, a diode using a material similar to that of the gate electrode may be fabricated and subjected to capacitance-voltage measurement. In this way, it is possible to use the threshold value defined by the surface applied voltage value obtained when the density of channel electrons is negligibly low in this capacitance-voltage measurement.

By adopting the method described above, the following is possible in the fabrication of multilayer epitaxial layers applicable to a heterojunction FET.

First, in the fabrication of a multilayer epitaxial substrate having predetermined electric characteristics (for example, the transistor threshold value is a predetermined value in the fabrication of a field effect transistor), one or more of the thicknesses, impurity concentrations, and composition values of epitaxial layers constituting the multilayer epitaxial substrate are determined by theoretical calculation so that the electric characteristics are satisfied. Epitaxy is then performed according to the determined values. In this way, the work of combining the epitaxial layers is made significantly more efficient, compared with the conventional technique in which all parameters are experimentally determined.

Second, in the fabrication of a multilayer epitaxial substrate having predetermined electric characteristics (for example, the transistor threshold value is a predetermined value in the fabrication of a field effect transistor), it may be experimentally impossible to preliminarily adjust predetermined design values of the thicknesses, and/or impurity concentrations of epitaxial layers constituting the multilayer epitaxial substrate. In such a case, the thicknesses, impurity concentrations, and/or compositions of the epitaxial layers of which preliminary adjustment is impossible are adjusted so as to agree with the electric characteristics obtained from the design values by theoretical calculation. Epitaxy is then performed according to the adjusted values. In this way, it is possible to appropriately determine the values of parameters of which preliminary adjustment is difficult.

EXAMPLES

Hereinafter, the present invention will be described in more detail by way of example.

Example 1

A multilayer epitaxial substrate as shown in FIG. 3 was fabricated in the following manner. The target values of the electric characteristics required for the epitaxial layers of the epitaxial substrate excluding the first layer were a sheet electron concentration of $2.4 \times 10^{12}/cm^2$ and $V_{th} = -2.0$ V. (Note that capacitance-voltage (CV) measurement was performed by attaching a Schottky electrode to the surface, and a voltage value applied to the Schottky electrode when the carrier concentration was $1 \times 10^{15}/cm^3$ in the depth direction distribution obtained from the CV data was defined as the threshold voltage ($V_{th}$).)

Although the compositions and thicknesses of the layers of the multilayer epitaxial substrate were determined as shown in FIG. 3, the doping concentration with which the desired electric characteristics described above were obtainable was unknown. In this example, using the doping concentration of the n-type AlGaAs layer as a variable parameter, the correlation between the sheet electron concentration and the surface potential of this epitaxial layer was examined using a technique similar to the theoretical calculation shown in FIG. 1. As a result, it was found that values very close to the target values of the sheet electron concentration of $2.41 \times 10^{12}/cm^2$ and $V_{th} = -2.04$ V were obtained when the doping concentration was $2.8 \times 10^{18}/cm^3$.

Subsequently, multilayer epitaxy was performed by metal organic chemical vapor deposition. More specifically, on a GaAs single crystal wafer having a clean surface, epitaxially grown were trimethylgallium, trimethylaluminum, trimethylindium, and arsine as main materials and disilane as an n-type dopant with hydrogen gas as a carrier gas at a crystal growth rate of about 20 nm/min and a growth temperature of 650 to 675° C. (GaAs and AlGaAs layers) and 575° C. (InGa ks layer), to obtain the multilayer epitaxial substrate having good mirror-smoothness.

The flow rate of disilane as the dopant for the growth of the n-type AlGaAs layers was determined in the following manner. Prior to the epitaxy, an AlGaAs layer having a thickness of 500 nm was fabricated under the same growth conditions as those for the n-type AlGaAs layers, and the correlation between the electron concentration and the disilane flow rate was obtained by CV measurement. The disilane flow rate corresponding to the electron concentration giving $2.8 \times 10^{18}/cm^3$ was determined from the correlation expression.

The resultant epitaxial wafer was subjected to X-ray diffraction measurement. As a result, the proportion of In in the InGaAs layer was 0.195 and the thickness of the InGaAs layer was 14.9 nm. The total thickness of the GaAs layer and the AlGaAs layers formed above the InGaAs layer was 49.2 nm. These satisfactorily agreed with the design values.

The epitaxial wafer was then subjected to Hall measurement to measure the sheet electron concentration. The $V_{th}$ of the epitaxial wafer was also measured by CV measurement by fabricating a Schottky barrier diode having an Al electrode. As a result, the sheet electron concentration and the $V_{th}$ were $2.4 \times 10^{12}/cm^2$ and $-2.05$ V, respectively, which were found to satisfy the desired characteristics.

Example 2

A multilayer epitaxial substrate as shown in FIG. 4 was fabricated in the following manner. The compositions, thicknesses, and doping concentrations of the layers of the multilayer epitaxial substrate were determined as shown in FIG. 4. The doping concentration of the n-type AlGaAs layer was determined by preliminary calibration as in Example 1.

However, as for the n-type InGaAs layer, which is a so-called pseudomorphic quantum well layer, lattice relaxation will arise if the above technique is adopted. Accordingly, correct calibration of the doping concentration is impossible for the n-type InGaAs layer.

In this case, therefore, the sheet electron concentration and $V_{th}$ of the epitaxial layers of the epitaxial substrate excluding the first layer were determined using theoretical calculation as described in Example 1, and the results were $1.63 \times 10^{12}/cm^2$ and $V_{th} = -1.02$ V, respectively.

Subsequently, multilayer epitaxy was performed by metal organic chemical vapor deposition. More specifically, on a GaAs single crystal wafer having a clean surface, epitaxially grown were trimethylgallium, trimethylaluminum, trimethylindium, and arsine as main materials and disilane as an n-type dopant with hydrogen gas as a carrier gas at a crystal growth rate of about 20 nm/min and a growth temperature of 650 to 675° C. (GaAs and AlGaAs layers) and 575° C. (InGaAs layer), to obtain the multilayer epitaxial substrate having good mirror-smoothness.

The flow rate of disilane as the dopant for the growth of the n-type InGaAs layer was varied for three levels, and the resultant multilayer epitaxial wafers for the three levels were subjected to X-ray diffraction measurement. As a result, the proportion of In in the InGaAs layer was 0.180 to 0.175 and the thickness of the InGaAs layer was 15.1 to 14.8 nm. The total thickness of the GaAs layer and the AlGaAs layers formed above the InGaAs layer was 37.7 to 37.5 nm. These satisfactorily agreed with the design values.

The epitaxial wafer was then subjected to Hall measurement to measure the sheet electron concentration. The $V_{th}$ of the epitaxial wafer was also measured by CV measurement by fabricating a Schottky barrier diode having an Al electrode. As a result, the sheet electron concentration of $1.65 \times 10^{12}/cm^2$ and $V_{th}$ of $-1.01$ V were obtained when the disilane flow rate was $9.0 \times 10^4$ sccm, which were found to satisfy the desired characteristics.

Example 3

A multilayer epitaxial substrate as shown in FIG. 5 was fabricated in the following manner. This epitaxial substrate was required to have a multilayer epitaxial structure where the sheet electron concentration and $V_{th}$ of the epitaxial layers excluding the first layer were $2.5 \times 10^{12}/cm^2$ and $-1.8$ V, respectively.

To attain the above requirement, the doping concentration of the n-type AlGaAs was calculated using theoretical calculation as described in Example 1 so that the sheet electron concentration and $V_{th}$ of the epitaxial layers of the epitaxial substrate excluding the first layer match with the desired values. As a result, as the theoretical calculation values, the sheet electron concentration of $2.54 \times 10^{12}/cm^2$ and $V_{th} = -1.82$ V were obtained when the doping concentration was $8.5 \times 10^{18}/cm^3$. It was therefore found possible to satisfy the target values.

Subsequently, multilayer epitaxy was performed by metal organic chemical vapor deposition. More specifically, on a GaAs single crystal wafer having a clean surface, epitaxially grown were trimethylgallium, trimethylaluminum, trimethylindium, and arsine as main materials and disilane as an n-type dopant with hydrogen gas as a carrier gas at a crystal growth rate of about 20 nm/min and a growth temperature of 650 to 675° C. (GaAs and AlGaAs layers) and 575° C. (InGaAs layer), to obtain the multilayer epitaxial substrate having good mirror-smoothness.

Prior to the epitaxy, an AlGaAs layer having a thickness of 500 nm was fabricated under the same growth conditions as those for the n-type AlGaAs layers, and the correlation between the electron concentration and the disilane flow rate was obtained by CV measurement. As a result, it was found that although the disilane flow rate and the doping concentration were proportional to each other when the doping concentration was $3.5 \times 10^{18}/cm^3$ or less, this proportional relationship was lost when the doping concentration exceeds this value, and the calibration was impossible when the doping concentration further increased.

From the above results, determined was the disilane flow rate with which the doping concentration of $8.5 \times 10^{18}/cm^3$ as the target value by the theoretical calculation should be obtained, by extrapolation from the proportional portion of the low-concentration area.

The resultant multilayer epitaxial wafer was subjected to X-ray diffraction. As a result, the proportion of In in the InGaAs layer was 0.198 and the thickness of the InGaAs layer was 14.8 nm. The total thickness of the GaAs layer and the AlGaAs layers formed above the InGaAs layer was 39.8 nm. These satisfactorily agreed with the design values.

The epitaxial wafer was then subjected to Hall measurement to measure the sheet electron concentration. The $V_{th}$ of the epitaxial wafer was also measured by CV measurement by fabricating a Schottky barrier diode having an Al electrode. As a result, the sheet electron concentration of $2.6 \times 10^{12}/cm^2$ and $V_{th}$ of $-1.81$ V were obtained, which were found to satisfy the desired characteristics.

According to the present invention, the adjustment of a number of design parameters (thickness, impurity concentration, and composition), which are indispensable for manufacture of a multilayer epitaxial substrate, is dramatically made efficient. In addition, adjustment of parameters that has conventionally been impossible is now possible. These provide significant industrial contribution.

The invention thus being described, it will be apparent that the same may be varied in many ways. Such variations are not to be regarded as a departure from the spirit and scope of the invention, and all such modifications as would be apparent to one skilled in the art intended to be included within the scope of the following claims.

What is claimed is:

1. A method for fabricating a compound semiconductor multilayer epitaxial substrate comprising a plurality of epitaxial layers, and including at least one $In_yGa_{(1-y)}As$ ($0 \leq y \leq 1$) layer, and the at least one layer is an electron running channel layer, wherein said method comprises the steps of determining at least one of the thickness, impurity concentration, and composition of an epitaxial layer comprising the multilayer epitaxial substrate by theoretical calculation, the theoretical calculation describing an electric field and charge distribution inside the epitaxial layer, and performing epitaxy of the epitaxial layer according to the theoretical calculation of the thickness, impurity concentration, composition of the epitaxial layer so that measurable electrical characteristics of the substrate predetermined by the calculation are satisfied.

2. A method for fabricating a compound semiconductor multilayer epitaxial substrate comprising a plurality of epitaxial layers, and including at least one $In_yGa_{(1-y)}As$ ($0 \leq y \leq 1$) layer, and the at least one layer is an electron running channel layer, wherein said method comprises the steps of obtaining theoretical electrical characteristics of at least one epitaxial layer of the multilayer epitaxial substrate from predetermined design values for the thickness, impurity concentration, and composition of the epitaxial layer by theoretical calculation to describe the electric field and charge distribution inside the epitaxial layer, and adjusting at least one of the thickness, impurity concentration, and composition of the epitaxial layer so as to agree with the theoretical electrical characteristics predetermined by the theoretical calculation during epitaxy, to perform the epitaxy of the epitaxial layer.

3. A method for fabricating a compound semiconductor multilayer epitaxial substrate according to claim 1 or 2, wherein the substrate used for the epitaxy is Si, GaAs, InP, or sapphire, and the epitaxial layer is of a single crystal III–V group compound semiconductor where the group III element is selected from the group consisting of Al, Ga and In, and the group V element is selected from the group of N, P and As.

4. A method for fabricating a compound semiconductor multilayer epitaxial substrate according to claim 1 or 2, wherein the compound semiconductor multilayer epitaxial substrate is used for fabrication of a heterostructure field effect transistor or an integrated circuit including a heterostructure field effect transistor.

5. A method for fabricating a compound semiconductor multilayer epitaxial substrate according to claim 4, wherein the heterostructure field effect transistor includes an $Al_xGa_{(1-x)}As$ ($0 \leq x \leq 1$) layer and at least one $In_yGa_{(1-y)}As$ ($0 \leq y \leq 1$) layer.

6. A method for fabricating a compound semiconductor multilayer epitaxial substrate according to claim 4, wherein the heterostructure field effect transistor has a junction of crystal layers having different electron affinities, and thus has a selectively doped structure constructed of the junction.

7. A method for fabricating a compound semiconductor multilayer epitaxial substrate according to claim 1 or 2, wherein the compound semiconductor multilayer epitaxial substrate includes at least one $In_yGa_{(1-y)}As$ ($0 \leq y \leq 1$) layer that does not lattice-match with a substrate single crystal and has a thickness within a lattice relaxation limit, and the at least one layer is an electron running channel layer.

8. A method for fabricating a compound semiconductor multilayer epitaxial substrate according to claim 5, wherein the $In_yGa_{(1-y)}As$ ($0 \leq y \leq 1$) layer is an n-type doped layer.

9. A method for fabricating a compound semiconductor multilayer epitaxial substrate according to claim 4, wherein, prior to fabrication of the multilayer epitaxial substrate, the thickness, impurity concentration, or composition of the epitaxial layer is adjusted for an epitaxial substrate in which the entire or part of a top-layer n-type epitaxial layer doped in a concentration of $3 \times 10^{17}/cm^3$ or more with which an ohmic electrode of the heterostructure field effect transistor is to be in contact has not been epitaxially grown or has been removed by etching, and subsequently the same structure is epitaxially grown under the same conditions to deposit a top-layer n-type epitaxial layer doped in a concentration of $3 \times 10^{17}/cm^3$ or more with which the ohmic electrode of the heterostructure field effect transistor is to be in contact, to complete the epitaxy.

* * * * *